US012690394B2

(12) United States Patent
Huang et al.

(10) Patent No.: US 12,690,394 B2
(45) Date of Patent: Jul. 21, 2026

(54) THIN FILM TRANSISTOR AND ULTRASONIC IMAGING BASE BOARD

(71) Applicant: BOE Technology Group Co., Ltd., Beijing (CN)

(72) Inventors: Rui Huang, Beijing (CN); Zhao Cui, Beijing (CN); Jinchao Zhang, Beijing (CN); Wenqu Liu, Beijing (CN); Yue Tong, Beijing (CN); Liwei Liu, Beijing (CN); Yonggang Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 372 days.

(21) Appl. No.: 18/274,052

(22) PCT Filed: Jul. 15, 2022

(86) PCT No.: PCT/CN2022/106026
§ 371 (c)(1),
(2) Date: Jul. 25, 2023

(87) PCT Pub. No.: WO2024/011600
PCT Pub. Date: Jan. 18, 2024

(65) Prior Publication Data
US 2024/0431211 A1      Dec. 26, 2024

(51) Int. Cl.
| | |
|---|---|
| *H10N 39/00* | (2026.01) |
| *H10D 30/67* | (2025.01) |
| *H10K 59/00* | (2023.01) |
| *H10N 30/30* | (2023.01) |
| *H10N 30/87* | (2023.01) |

(52) U.S. Cl.
CPC ......... *H10N 30/87* (2023.02); *H10D 30/6731* (2025.01); *H10D 30/6732* (2025.01); *H10D 30/6734* (2025.01); *H10N 30/302* (2023.02); *H10K 59/00* (2023.02); *H10N 39/00* (2023.02)

(58) Field of Classification Search
CPC ...... H10N 30/87; H10N 30/302; H10N 39/00; H10K 59/00; H10D 30/6731; H10D 30/6732; H10D 30/6734
See application file for complete search history.

(56) References Cited

U.S. PATENT DOCUMENTS

| | | | | |
|---|---|---|---|---|
| 12,380,727 | B1* | 8/2025 | Xiong | H10K 59/60 |
| 2018/0254351 | A1* | 9/2018 | Jung | H10K 10/484 |
| 2019/0251378 | A1* | 8/2019 | Jung | A61B 5/1172 |
| 2020/0075767 | A1 | 3/2020 | Jang et al. | |
| 2020/0287052 | A1* | 9/2020 | Qu | H10K 59/131 |

(Continued)

FOREIGN PATENT DOCUMENTS

| | | |
|---|---|---|
| CN | 106684155 A | 5/2017 |
| CN | 111725250 A | 9/2020 |

(Continued)

*Primary Examiner* — David Vu
*Assistant Examiner* — Brandon C Fox
(74) *Attorney, Agent, or Firm* — WHDA, LLP

(57) ABSTRACT

A thin film transistor and an ultrasonic imaging base board. The thin film transistor includes: a substrate (100), and a first gate (101), a first gate insulation layer (102), a first active layer (103), a second gate insulation layer (104) and a second gate (105) stacked on a side of the substrate (100), and the first gate (101) is connected to the second gate (105).

14 Claims, 9 Drawing Sheets

(56)  References Cited

U.S. PATENT DOCUMENTS

| | | | |
|---|---|---|---|
| 2020/0403045 A1 | 12/2020 | Yeon et al. | |
| 2021/0200366 A1* | 7/2021 | Bok | H04R 7/04 |
| 2022/0005901 A1 | 1/2022 | Tanaka et al. | |
| 2022/0375966 A1 | 11/2022 | Dong et al. | |
| 2025/0194341 A1* | 6/2025 | Choi | H01M 4/131 |

FOREIGN PATENT DOCUMENTS

| | | | |
|---|---|---|---|
| CN | 112117303 A | 12/2020 |
| CN | 113889487 A | 1/2022 |
| CN | 113990898 A | 1/2022 |

* cited by examiner

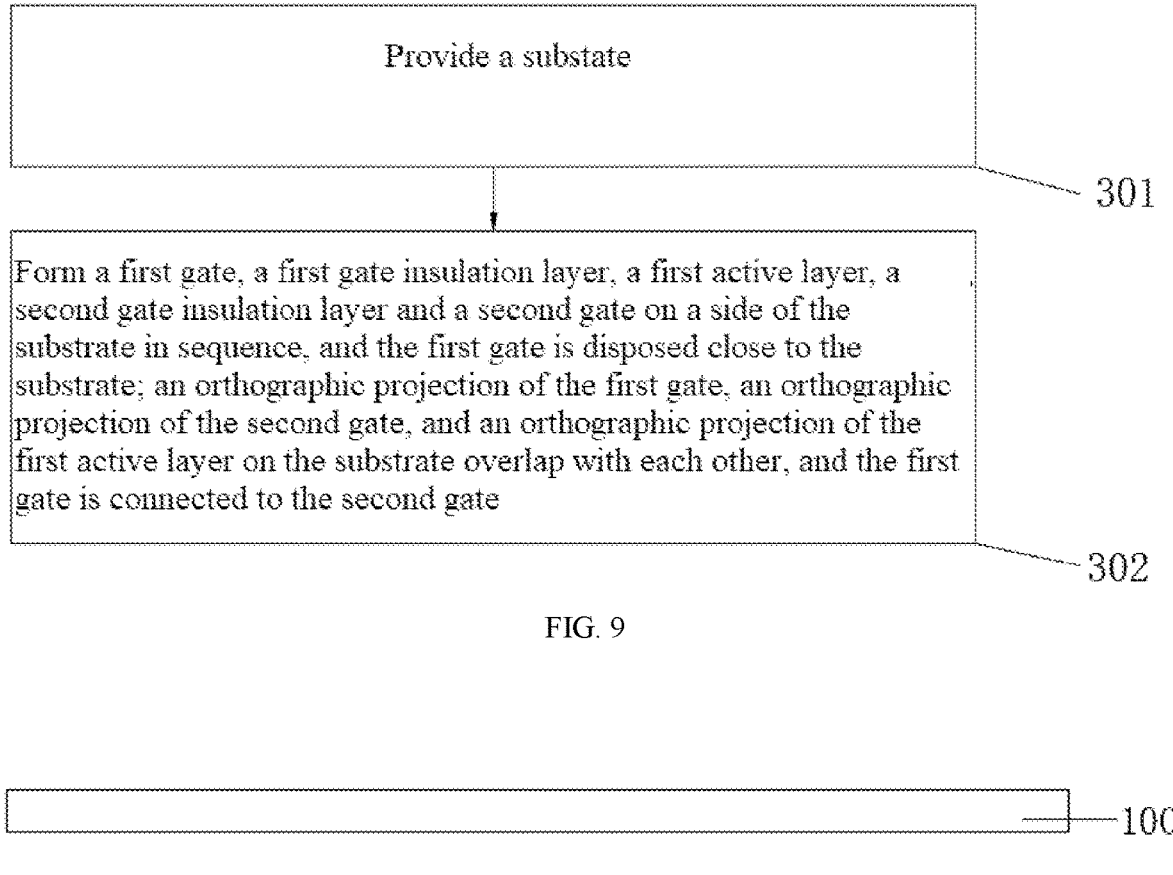

| Provide a substate |
| --- |

~ 301

Form a first gate, a first gate insulation layer, a first active layer, a second gate insulation layer and a second gate on a side of the substrate in sequence, and the first gate is disposed close to the substrate; an orthographic projection of the first gate, an orthographic projection of the second gate, and an orthographic projection of the first active layer on the substrate overlap with each other, and the first gate is connected to the second gate

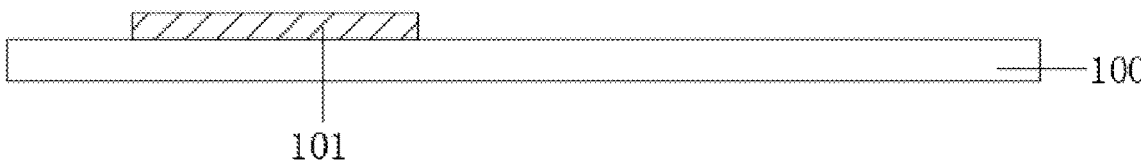

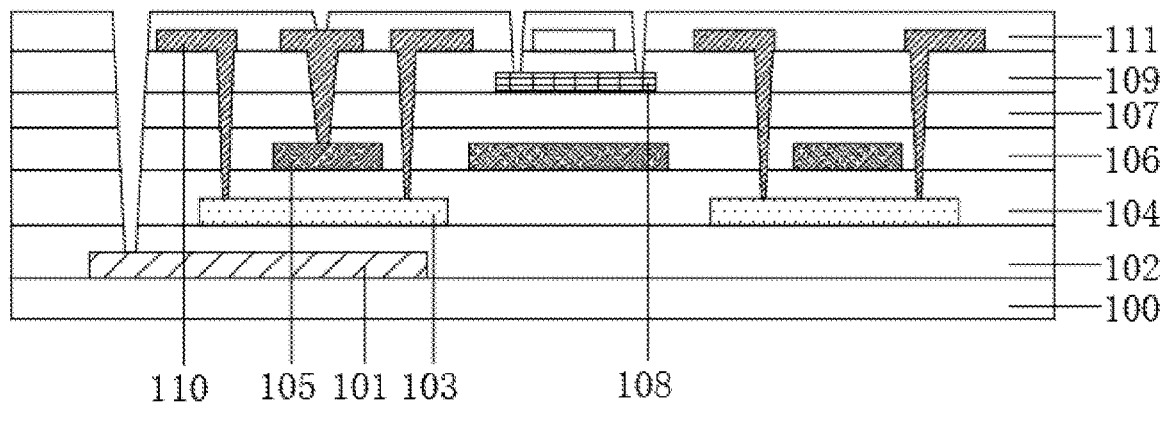
FIG. 16
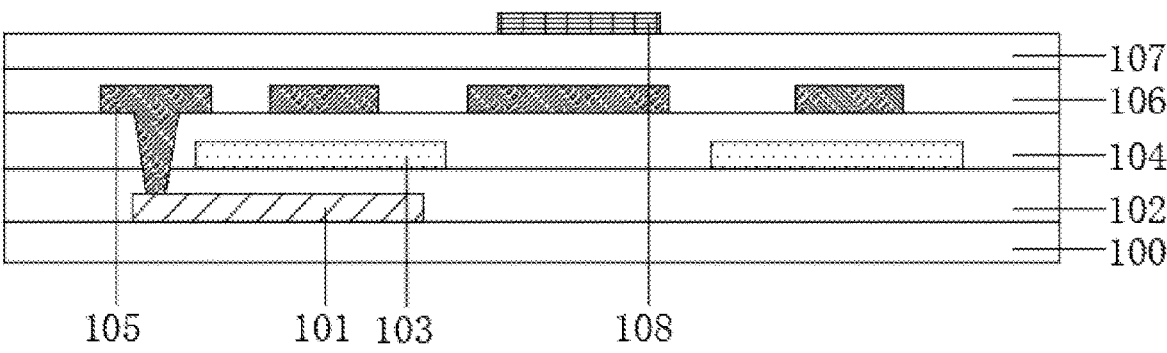
FIG. 17
FIG. 18

109
107
106
104
102
100

105   110      101  103              108

111
109
107
106
104
102
100

105   110      101  103  119       108

THIN FILM TRANSISTOR AND ULTRASONIC IMAGING BASE BOARD

CROSS-REFERENCE TO RELATED APPLICATION

This application is a national phase application under 35 U.S.C. § 371 of International Patent Application No. PCT/CN2022/106026 filed on Jul. 15, 2022, the entire contents of which are incorporated herein by reference.

TECHNICAL FIELD

The present disclosure relates to the field of display technology, in particular to a thin film transistor and an ultrasonic imaging base board.

BACKGROUND

With the development of technology, the ultrasonic testing technology is more and more widely used in fields such as medical testing, mobile communication, industrial flaw detection. A key index for the quality of ultrasonic imaging is the definition thereof, especially in the field of medical testing, the higher the definition, the more conducive to an accurate judgment and a reasonable medical treatment. Key factors affecting definition in an ultrasonic imaging backplane include the sensitivity of piezoelectric materials, the trans-conductance of the amplification circuit, and the overall noise of the signal system.

In the existing ultrasonic imaging backplane, the amplification circuit mainly adopts the low temperature polysilicon (LTPS) process, because the LTPS has higher mobility than amorphous silicon and oxide, which is conducive to improving the trans-conductance. As the resolution of the backplane increases, the requirements for the trans-conductance of the amplification circuit become higher and higher. In addition, the thin film transistor (TFT) in the amplification circuit is easily to be affected by the floating body effect, resulting in deterioration of current uniformity and increased noise, which also needs to be suppressed.

SUMMARY

A first aspect of the present disclosure provides a thin film transistor, including:

a substrate, and a first gate, a first gate insulation layer, a first active layer, a second gate insulation layer, and a second gate stacked on a side of the substrate, wherein the first gate is disposed close to the substrate; an orthographic projection of the first gate on the substrate, an orthographic projection of the second gate on the substrate, and an orthographic projection of the first active layer on the substrate overlap with each other, and the first gate is connected to the second gate.

Optionally, the second gate is connected to the first gate through a via hole penetrating through the first gate insulation layer and the second gate insulation layer.

Optionally, the thin film transistor further includes: a third gate disposed on a side of the second gate facing away from the substrate, wherein the third gate is served as a source and a drain of the thin film transistor, and is connected to the first active layer.

Optionally, the third gate is connected to the second gate; the thin film transistor further comprises a transfer metal layer disposed on a side of the third gate facing away from the second gate, and the transfer metal layer is connected to the first gate and the third gate respectively, so that the second gate is connected to the first gate.

Optionally, the thin film transistor further includes: a third insulation layer disposed between the second gate and the third gate; and a fourth insulation layer disposed between the third gate and the transfer metal layer; the transfer metal layer is connected to the first gate through a via hole penetrating through the fourth insulation layer, the third insulation layer, the second gate insulation layer and the first gate insulation layer; the transfer metal layer is connected to the third gate through a via hole penetrating through the fourth insulation layer; the third gate is connected to the second gate through a via hole penetrating through the third insulation layer.

Optionally, the first active layer includes a plurality of sub-regions separated from each other in a first direction; in the first direction, the orthographic projection of the first gate on the substrate and the orthographic projection of the second gate on the substrate both cover the orthographic projection of the first active layer on the substrate; a recessed region exists between two adjacent sub-regions, and the second gate is arranged to at least partially fill the recessed region, and the orthographic projection of the second gate on a first plane at least partially covers the orthographic projection of the sub-region on the first plane; the first plane is perpendicular to the first direction.

Optionally, the first active layer includes: a channel region, and a source contact region and a drain contact region located on two sides of the channel region; the orthographic projection of the first gate on the substrate and the orthographic projection of the second gate on the substrate cover the orthographic projection of the channel region on the substrate; an ion doping concentration of the source contact region and the drain contact region is greater than the ion doping concentration of the channel region.

Optionally, the channel region includes: a first channel region and a second channel region separated from each other in a second direction; the second gate comprises a first sub-gate and a second sub-gate separated from each other in the second direction; in the second direction, the orthographic projection of the first sub-gate on the substrate completely overlaps with the orthographic projection of the first channel region on the substrate, and the orthographic projection of the second sub-gate on the substrate completely overlaps with the orthographic projection of the second channel region on the substrate.

Optionally, a material of the channel region includes polysilicon, amorphous silicon, or oxide semiconductor.

A second aspect of the present disclosure provides an ultrasonic imaging base board including a signal amplification transistor and a conversion transistor connected to the signal amplification transistor, and the signal amplification transistor is the thin film transistor according to the first aspect of the present disclosure.

The ultrasonic imaging base board further includes:

a piezoelectric conversion unit, configured to convert an ultrasonic pressure signal received by the ultrasonic imaging base board into an electrical signal, and the piezoelectric conversion unit is connected to the conversion transistor.

Optionally, the conversion transistor includes:

a buffer layer, disposed on a side of the signal amplification transistor;

a second active layer disposed on the buffer layer; and a connection metal layer disposed between the piezoelectric conversion unit and the second active layer, wherein the connection metal layer is served as the source and drain of the conversion transistor, and is connected to the second active layer.

Optionally, the piezoelectric conversion unit includes:

a first electrode layer disposed on a side of the connection metal layer facing away from the second active layer, and the first electrode layer is connected to the connection metal layer;

a piezoelectric film layer disposed on a side of the first electrode layer facing away from the connection metal layer; and a second electrode layer disposed on a side of the piezoelectric film layer facing away from the first electrode layer.

Optionally, the ultrasonic imaging base board further includes:

a fifth insulation layer disposed between the first electrode layer and the connection metal layer, and the first electrode layer is connected to the connection metal layer through a via hole penetrating through the fifth insulation layer.

Optionally, the ultrasonic imaging base board further includes a second passivation layer disposed between the first electrode layer and the piezoelectric film layer.

Optionally, the signal amplification transistor includes a transfer metal layer; and the transfer metal layer and the connection metal layer are arranged in the same layer.

A third aspect of the present disclosure provides an ultrasonic imaging device including the ultrasonic imaging base board as described in the second aspect of the present disclosure.

A fourth aspect of the present disclosure provides a method for preparing a thin film transistor, including:

providing a substrate;

forming a first gate, a first gate insulation layer, a first active layer, a second gate insulation layer and a second gate on a side of the substrate in sequence, and the first gate is disposed close to the substrate;

an orthographic projection of the first gate on the substrate, an orthographic projection of the second gate on the substrate, and an orthographic projection of the first active layer on the substrate overlap with each other, and the first gate is connected to the second gate.

BRIEF DESCRIPTION OF THE DRAWINGS

In order to describe embodiments of the present disclosure or technical solutions in the related art more clearly, the accompanying drawings which are used in the description of the embodiments or the related art will be briefly introduced. Apparently, the accompanying drawings in the following description illustrate some embodiments of the present disclosure, and those skilled in the art may obtain other accompanying drawings based on these accompanying drawings without paying any creative effort.

FIG. 9 is a flow chart illustrating steps of a method for preparing a thin film transistor proposed by an embodiment of the present disclosure;

FIG. 10 is a schematic structural diagram illustrating a thin film transistor proposed by an embodiment of the present disclosure with the substrate being prepared;

FIG. 11 is a schematic structural diagram illustrating a thin film transistor proposed by an embodiment of the present disclosure with a first gate being prepared;

FIG. 16 is a schematic structural diagram illustrating another thin film transistor proposed by an embodiment of the present disclosure with a first interlayer dielectric layer, a buffer layer, a third gate insulation layer, a third gate and a second interlayer dielectric layer being prepared;

FIG. 17 is a schematic structural diagram illustrating another thin film transistor proposed by an embodiment of the present disclosure with a metal layer being prepared;

FIG. 18 is a schematic structural diagram illustrating an ultrasonic display substrate proposed by an embodiment of the present disclosure with the first interlayer dielectric layer, the buffer layer and the second active layer being prepared;

DETAILED DESCRIPTION OF THE EMBODIMENTS

In order to make the objects, technical solutions and advantages of the embodiments of the present disclosure clearer, the technical solutions in the embodiments of the present disclosure will be clearly and thoroughly described below in conjunction with the drawings in the embodiments of the present disclosure. Apparently, the described embodiments are some of the embodiments of the present disclosure, rather than all the embodiments. All other embodiments obtained, based on the embodiments in the present disclosure, by those skilled in the art without paying creative efforts fall within the protection scope of the present disclosure.

In the related art, low temperature polysilicon thin film transistors are used in the amplification circuit of the ultrasonic imaging base board, but low temperature polysilicon thin film transistors are easily affected by the floating body effect. The floating body effect refers to an effect presented in a transistor formed by placing silicon on an insulator, the body potential and bias voltage of the transistor are related to the carrier recombination process; the transistor forms a capacitor relative to the substrate. Charges accumulate on the capacitor, resulting in adverse effects. For example, a parasitic transistor is formed in terms of structures due to charges, resulting in leakage of current and a high current consumption. Moreover, the floating body effect also easily leads to the deterioration of current uniformity and increase of noises in the signal system.

In view of the above, embodiments of the present disclosure provide a thin film transistor and an ultrasonic imaging base board, in which a first gate is disposed below a first active layer and the first gate is connected with a second gate. On the one hand, by connecting the first gate to the second gate, the first gate and the first active layer in the thin film transistor may form double channels, so that the thin film transistor can output more current under the same voltage. In turn, the trans-conductance of the thin film transistor is increased, thereby improving the signal amplification capability. On the other hand, after a fixed potential is generated under the first active layer, the floating body effect of the thin film transistor can be suppressed, thereby improving the current uniformity, reducing the noises of the signal system, and improving the signal-to-noise ratio.

In order to make the above objects, features and advantages of the present disclosure more comprehensible, the present disclosure will be further described in detail below in conjunction with the accompanying drawings and specific embodiments.

Figure 1:
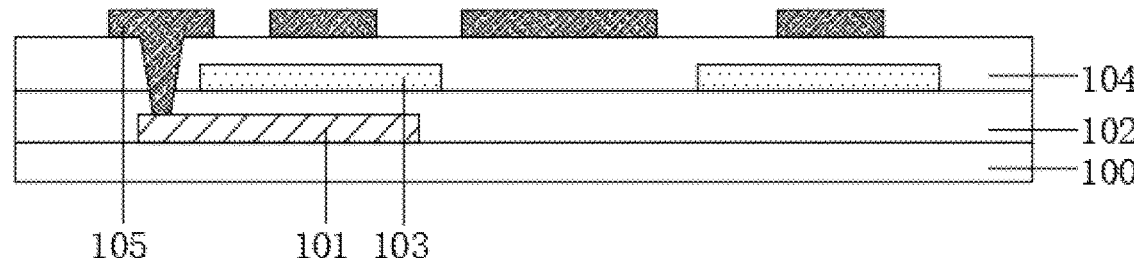
FIG. 1 is a schematic structural diagram illustrating a thin film transistor proposed by an embodiment of the present disclosure.

Reference is made to FIG. 1, which is a schematic structural diagram illustrating a thin film transistor provided by an embodiment of the present disclosure. As shown in FIG. 1, the thin film transistor may include a substrate 100, and a first gate 101, a first gate insulation layer 102, a first active layer 103, a second gate insulation layer 104 and a second gate 105 stacked on a side of the substrate 100.

Specifically, the substrate 100 may be made of glass materials.

The first gate 101 may be formed on one side of the substrate 100. For example, the substrate 100 includes a first surface and a second surface opposite to each other. The first gate 101 may be formed on the first surface of the substrate 100, or may be formed on the second surface of the substrate 100, which is not specifically limited in the embodiment of the present disclosure.

Furthermore, the material of the first gate 101 may be selected from metal materials or alloy materials. Since the first gate 101 is located on the substrate 100, it will not be affected by etching solution for upper layers during the preparation process, the selection range of the material of the first gate 101 may be larger. Exemplarily, the material of the first gate 101 may be molybdenum, aluminum, titanium and the like.

As shown in FIG. 1, the first gate insulation layer 102 may be formed on a side of the first gate 101 facing away from the substrate 100, and the first gate insulation layer 102 is arranged to cover the first gate 101. The first gate insulation layer 102 may include inorganic materials such as silicon oxide, silicon nitride, and the like.

As shown in FIG. 1, the first active layer 103 may be formed on the first gate insulation layer 102, and the second gate insulation layer 104 covers the first gate insulation layer 102 and the first active layer 103. The first active layer 103 may include a channel region, and a source contact region and a drain contact region (not shown in the figure) located on two sides of the channel region. The doping concentration of ions in the source contact region and the drain contact region is greater than the doping concentration of ions in the channel region. The material of the channel region may include polysilicon, amorphous silicon, or oxide semiconductor.

In the embodiment of the present disclosure, the channel region of the first active layer 103 is made of polysilicon material. Exemplarily, the first active layer 103 may be formed by crystallizing and patterning amorphous silicon (a-Si) deposited on the insulation layer of the first gate 101, and then the first active layer 103 is treated through a doping process to form the channel region, the source contact region and the drain contact region.

As shown in FIG. 1, the second gate insulation layer 104 is formed on a side of the first gate insulation layer 102 facing away from the substrate 100, and the second gate insulation layer 104 is arranged to cover the first active layer 103. The second gate insulation layer 104 may include inorganic materials such as silicon oxide, silicon nitride, and the like.

The second gate 105 is formed on a side of the second gate insulation layer 104 facing away from the first gate insulation layer 102. The second gate 105 may include metal materials or alloy materials, such as molybdenum, aluminum and titanium.

Moreover, as shown in FIG. 1, the second gate 105 is connected to the first gate 101 through a via hole penetrating through the second gate insulation layer 104 and the first gate insulation layer 102. Further, an orthographic projection of the first gate 101 on the substrate 100, an orthographic projection of the second gate 105 on the substrate 100, and an orthographic projection of the first active layer 103 on the substrate 100 overlap with each other. Specifically, the orthographic projection of the first gate 101 on the substrate and the orthographic projection of the second gate 105 on the substrate 100 cover the orthographic projection of the channel region of the first active layer 103 on the substrate 100. That is, in the thin film transistor, the positions of the first gate 101, the second gate 105 and the channel region of the first active layer 103 correspond to each other, so that both the top surface and the bottom surface of the first active layer 103 form a fixed potential.

Specifically, since the first gate 101 is connected to the second gate 105, the first gate 101 also has a fixed potential after a fixed potential is applied to the second gate 105. After the first gate 101 has a fixed potential, not only the first active layer 103 can be used as a channel layer to draw charges, but also the first gate 101 can be used as a channel layer to draw charges. Therefore, under the same voltage, the thin film transistor can output more current, thereby increasing the trans-conductance of the thin film transistor. In addition, by generating a fixed potential under the first active layer 103, the occurrence of charge parasitic transistors can be reduced, and the floating body effect of the thin film transistor can be suppressed, thereby improving current uniformity and reducing signal noises.

Figure 2:
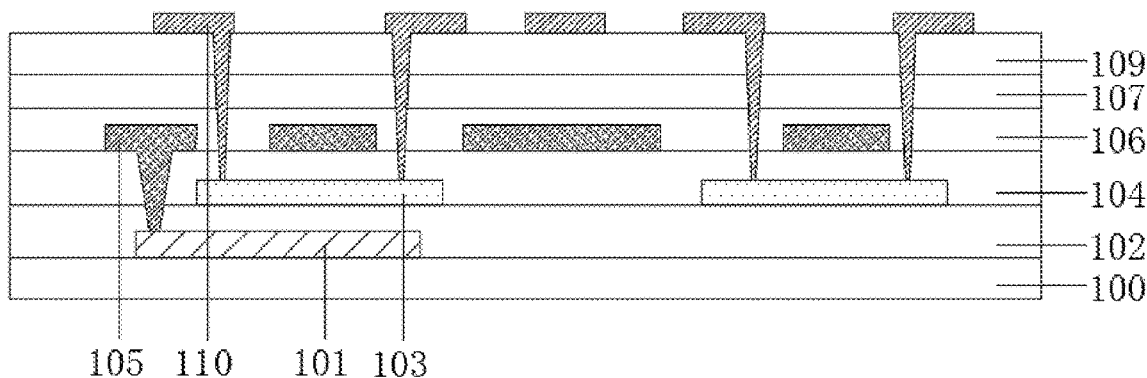
FIG. 2 is a schematic structural diagram illustrating a thin film transistor including a third gate proposed by an embodiment of the present disclosure.

In addition, as shown in FIG. 2, the thin film transistor further includes a third insulation layer and a third gate 110. The third gate 110 is disposed on a side of the second gate 105 facing away from the substrate 100, and the third insulation layer is arranged between the second gate 105 and the third gate 110. In an optional implementation, the third insulation layer may include a first interlayer dielectric layer 106, a buffer layer 107, and a third gate insulation layer 109.

Specifically, the first interlayer dielectric layer 106 is formed on a side of the second gate insulation layer 104 facing away from the first active layer 103, and the first interlayer dielectric layer 106 is arranged to cover the second gate 105. The first interlayer dielectric layer 106 may include inorganic materials such as silicon oxide, silicon nitride, and the like.

The buffer layer 107 is formed on a side of the first interlayer dielectric layer 106 facing away from the second gate 105, and the buffer layer 107 is arranged to cover the first interlayer dielectric layer 106. In some embodiments, the thin film transistor may not include the buffer Layer 107. In the embodiment, the buffer layer 107 is mainly used as a base for switching transistors in an ultrasonic imaging base board.

As shown in FIG. 2, the third gate insulation layer 109 is formed on a side of the buffer layer facing away from the first interlayer dielectric layer 106 107, and the third gate 110 is formed on the third gate insulation layer 109. The third gate 110 may include metal materials or alloy materials, for example, molybdenum, aluminum, titanium and the like.

The third gate 110 served as the source and the drain of the thin film transistor is located on opposite sides of the second gate 105, and the third gate 110 served as the source and the drain of the thin film transistor passes through the third gate insulation layer 109, the buffer layer 107, the first interlayer dielectric layer 106 and the second gate insulation layer 104, and is connected to the source contact region and the drain contact region of the first active layer 103 respectively.

The buffer layer 107 and the third gate insulation layer 109 may include inorganic materials such as silicon oxide, silicon nitride.

According to the thin film transistor provided by the present disclosure, on the one hand, the first gate 101 is configured to be connected to the second gate 105, so that the first gate 101 and the first active layer 103 in the thin film transistor form double channels. As a result, under the same voltage, the thin film transistor can output more current, thereby increasing the trans-conductance of the thin film transistor, and improving the signal amplification capability; on the other hand, after the fixed potential is formed under the first active layer 103, the floating body effect of the thin film transistor can be suppressed, thereby improving the current uniformity, reducing the noises of the signal system, and improving the signal-to-noise ratio.

Figure 3:
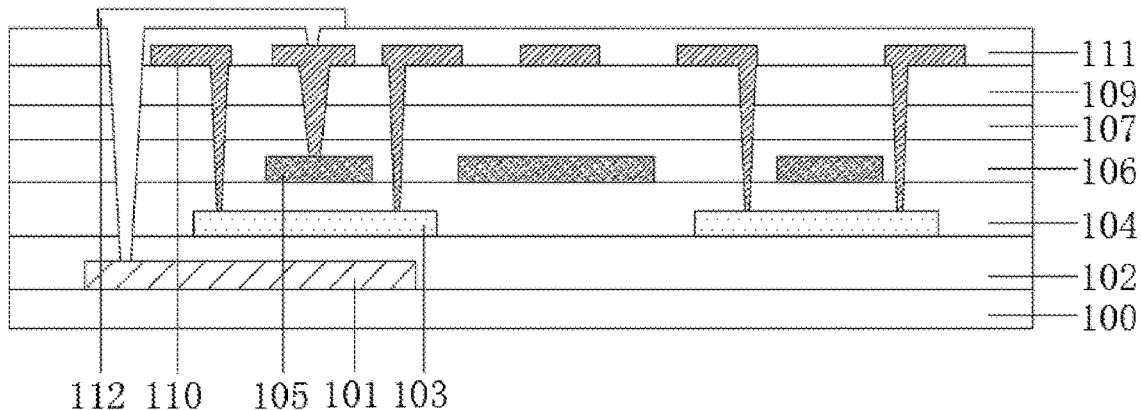
FIG. 3 is a schematic structural diagram illustrating another thin film transistor proposed by an embodiment of the present disclosure.

Referring to FIG. 3, an embodiment of the present disclosure further provides a thin film transistor. As shown in FIG. 3, in addition to the structures contained in the above thin film transistor, the thin film transistor further includes a transfer metal layer 112, and in the thin film transistor, the third gate 110 is connected to the second gate 105 through a via hole penetrating through the third insulation layer.

Specifically, as shown in FIG. 3, the transfer metal layer 112 is formed on a side of the third gate 110 facing away from the second gate 105, and the transfer metal layer 112 is connected to the first gate 101 and the third gate 110 respectively, so that the second gate 105 is indirectly connected to the first gate 101 through the transfer metal layer 112 and the third gate 110.

The transfer metal layer 112 may include metal materials or alloy materials, for example a metal single-layer or multi-layer structure made of molybdenum, aluminum, and titanium. For example, the multi-layer structure is a laminated structure of multiple metal layers, such as a laminated structure including three metal layers of titanium, aluminum, and titanium (Al/Ti/Al).

Further, as shown in FIG. 3, the thin film transistor further includes a fourth insulation layer disposed between the third gate 110 and the transfer metal layer 112.

In an optional implementation, the fourth insulation layer may include a second interlayer dielectric layer 111. Specifically, the second interlayer dielectric layer 111 is formed on a side of the third gate insulation layer 109 facing away from the second active layer 108, and the second interlayer dielectric layer 111 is arranged to cover the third gate 110. The second interlayer dielectric layer 111 may include inorganic materials such as silicon oxide, silicon nitride. The transfer metal layer 112 is formed on the second interlayer dielectric layer 111.

Specifically, as shown in FIG. 3, the third gate 110 is connected to the second gate 105 through a via hole penetrating through the third gate insulation layer 109, the buffer layer 107 and the first interlayer dielectric layer 106. The transfer metal layer 112 on the one hand is connected to the first gate 101 through a via hole penetrating through the third insulation layer (including the second interlayer dielectric layer 111, the third gate insulation layer 109, the buffer layer 107 and the first interlayer dielectric layer 106), the second gate insulation layer 104 and the first gate insulation layer 102, moreover, the transfer metal layer 112 on the other hand is also connected to the third gate 101 through a via hole penetrating through the fourth insulation layer including the second interlayer dielectric layer 111. In this way, the connection between the second gate 105 and the first gate 101 can be realized through the transfer metal layer 112 and the third gate 110.

According to the thin film transistor provided by the embodiment of the present disclosure, the connection between the second gate 105 and the first gate 101 is realized through the transfer metal layer 112 and the third gate 110, and the trans-conductance of the thin film transistor is improved. Moreover, by generating a fixed potential under the first active layer 103, the occurrence of charge parasitic thin film transistors can be reduced, thereby improving current uniformity and reducing signal noises. Further, a layer of masking process can be reduced by connecting the second gate 105 to the first gate 101 in this way, thus the preparation process of the thin film transistor is simplified.

Figure 4:
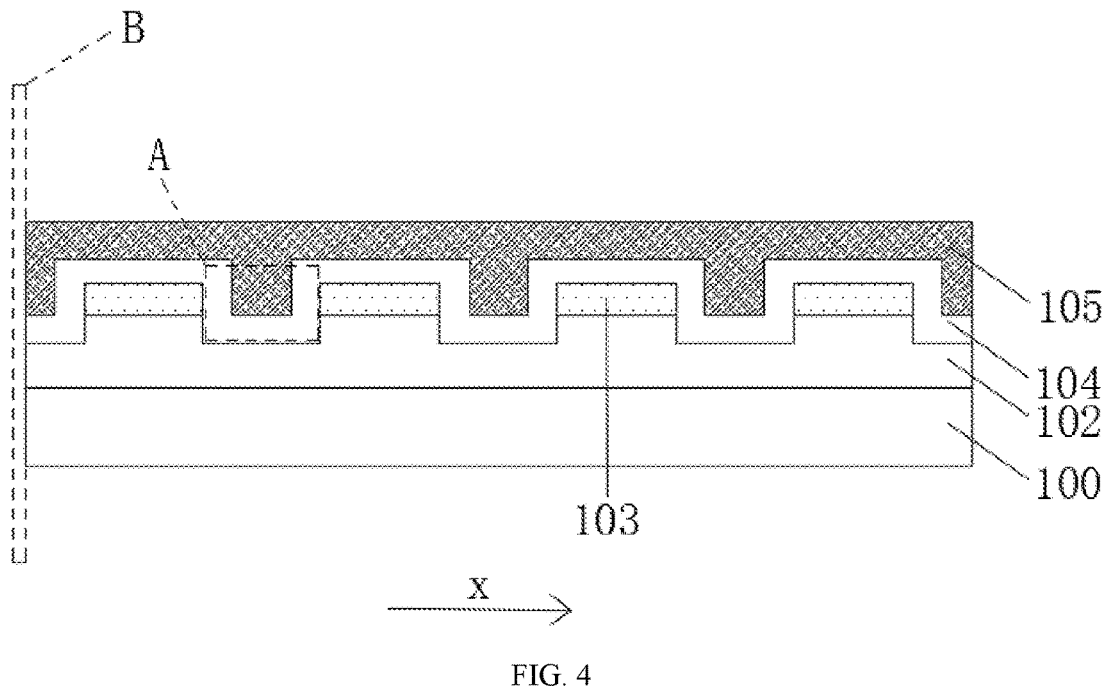
FIG. 4 is a schematic structural diagram illustrating a first active layer including multiple sub-regions proposed by an embodiment of the present disclosure.

In order to further improve the trans-conductance of the thin film transistor and the current uniformity, an embodiment of the present disclosure further provides a thin film transistor as shown in FIG. 4. In the thin film transistor, the first active layer 103 includes a plurality of sub-regions separated from each other in a first direction x, and in the first direction x, the orthographic projection of the first gate 101 and the second gate 105 on the substrate 100 covers the orthographic projection of the first active layer 103 on the substrate 100. A recessed region A exists between two adjacent sub-regions. The second gate 105 at least partially fills the recessed region A, so that the orthographic projection of the second gate 105 on the first plane B at least partially covers the orthographic projection of the sub-regions on the first plane B.

Figure 5:
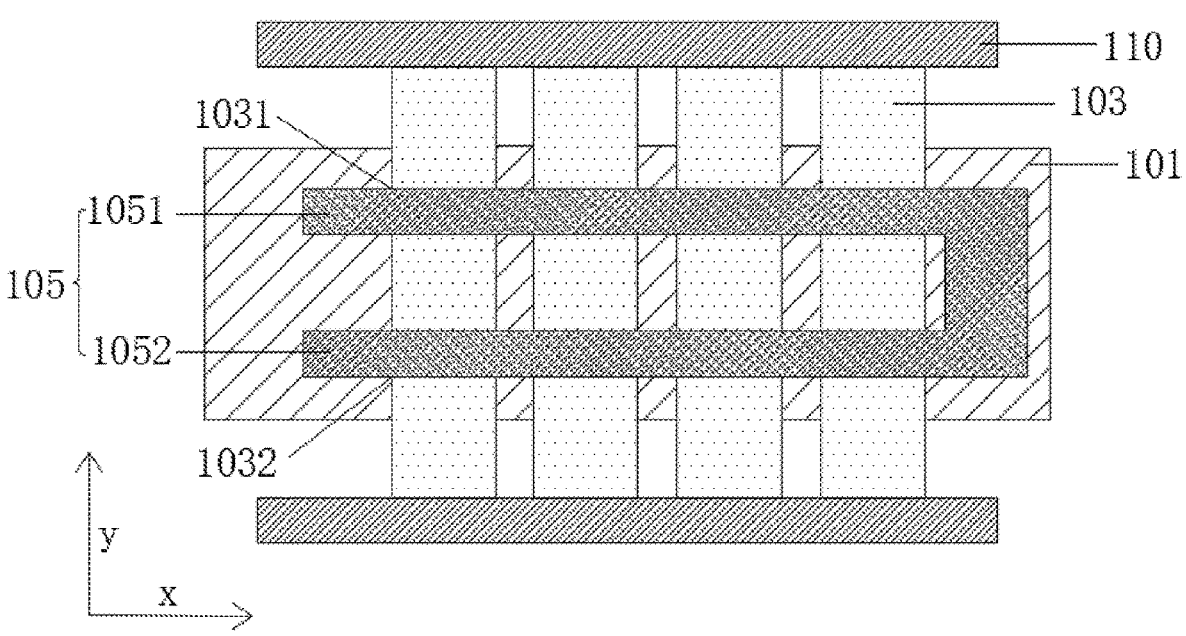
FIG. 5 is a schematic planar structural diagram illustrating a first active layer including multiple sub-regions proposed by an embodiment of the present disclosure.
Figure 6:
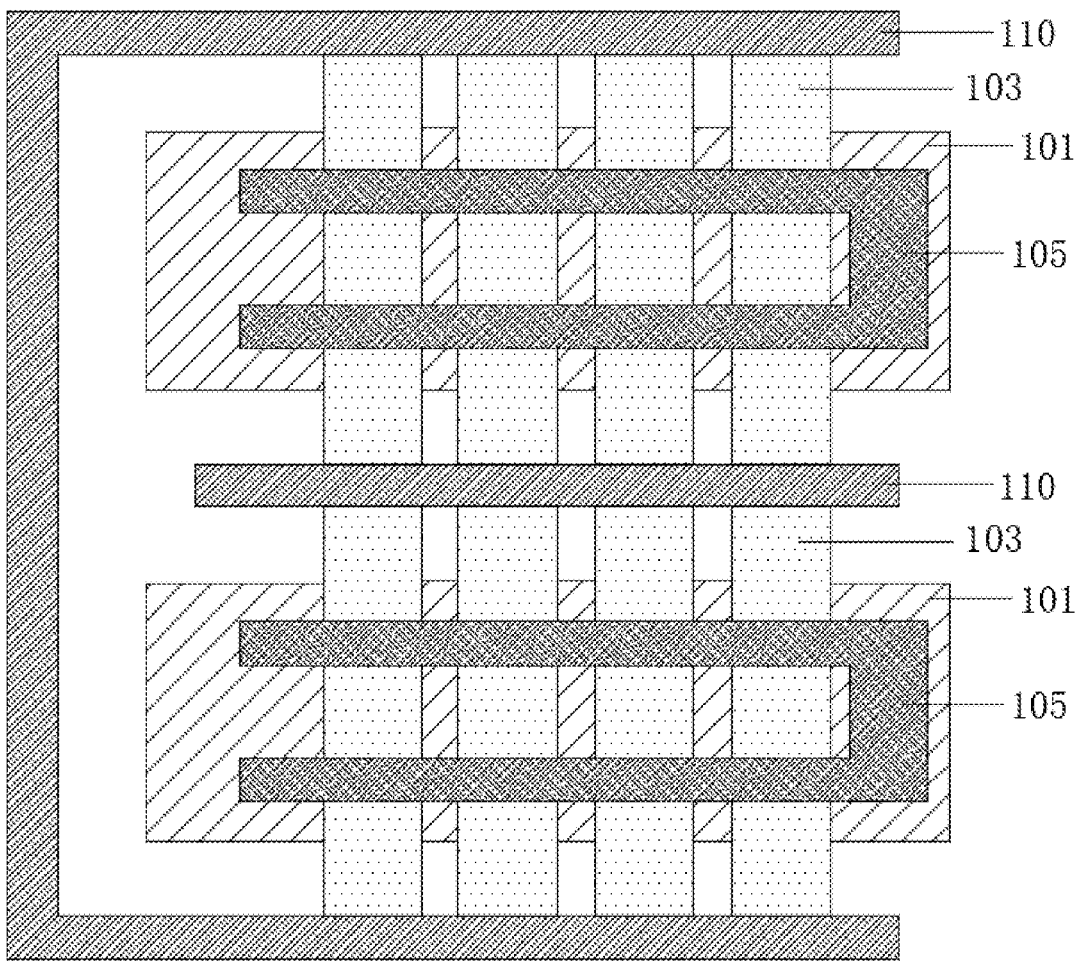
FIG. 6 is a schematic planar structural diagram illustrating another first active layer including multiple sub-regions proposed by an embodiment of the present disclosure.

Specifically, as shown in FIG. 5 and FIG. 6, the plurality of sub-regions of the first active layer 103 may be formed by etching, that is, after a whole slice of the first active layer 103 is formed, the first active layer 103 is etched so that the first active layer 103 is divided into a plurality of sub-regions. The plurality of sub-regions are arranged on the substrate 100 in a first direction, the first direction being any direction of the substrate 100, and the plurality of sub-regions may be arranged in multiple columns. Exemplarily, the plurality of sub-regions can be one column, two columns, and so on. To meet different design requirements, those skilled in the art can determine the distribution positions of the sub-regions according to actual conditions. Moreover, when the first active layer 103 is etched, the insulation layer of the first gate 101 is also etched.

Further, as shown in FIG. 4, a recessed region A is formed between two adjacent sub-regions, in the process of forming the second gate insulation layer 104 and the second gate 105, firstly, the second gate insulation layer 104 will fill each recessed region A, and a groove corresponding to each recessed region A is formed in the second gate insulation layer 104 at a position corresponding to the recessed region A, and then in the process of forming the second gate 105, the second gate 105 is made to fill the groove on each second gate 105, that is, the second gate 105 is made to fill each recessed region A. In this way, on the first plane B perpendicular to the first direction x, the orthographic projection of the second gate 105 on the first plane B may at least partially cover the orthographic projection of the sub-region on the first plane B, that is, the second gate 105 can cover each sub-region of the first active layer 103 in an inverted U shape, thereby forming a fixed potential on a side surface of the first active layer 103.

According to the thin film transistor provided by the embodiment of the present disclosure, the first active layer 103 is divided into a plurality of sub-regions, and the second gate 105 fills the recessed region A between every two adjacent sub-regions, so that the second gate 105 implements an inverted U-shaped cladding on the first active layer 103, combined with the arrangement of the first gate 101, a fixed potential can be formed on the top surface, bottom surface and side surfaces of the first active layer 103, thereby further increasing the trans-conductance of the thin film transistor and improving the current uniformity.

Moreover, as shown in FIG. 5, in the thin film transistor, the channel region of the first active layer 103 includes a first channel region 1031 and a second channel region 1032 separated from each other in a second direction y, and the second gate 105 includes a first sub-gate 1051 and a second sub-gate 1052 separated from each other in the second direction y. The second direction y is a direction perpendicular to the first direction x.

Moreover, in the second direction y, the orthographic projection of the first sub-gate 1051 on the substrate completely overlaps with the orthographic projection of the first channel region 1031 on the substrate, and the orthographic projection of the second sub-gate 1052 on the substrate completely overlaps with the orthographic projection of the second channel region 1032 on the substrate.

Figure 7:
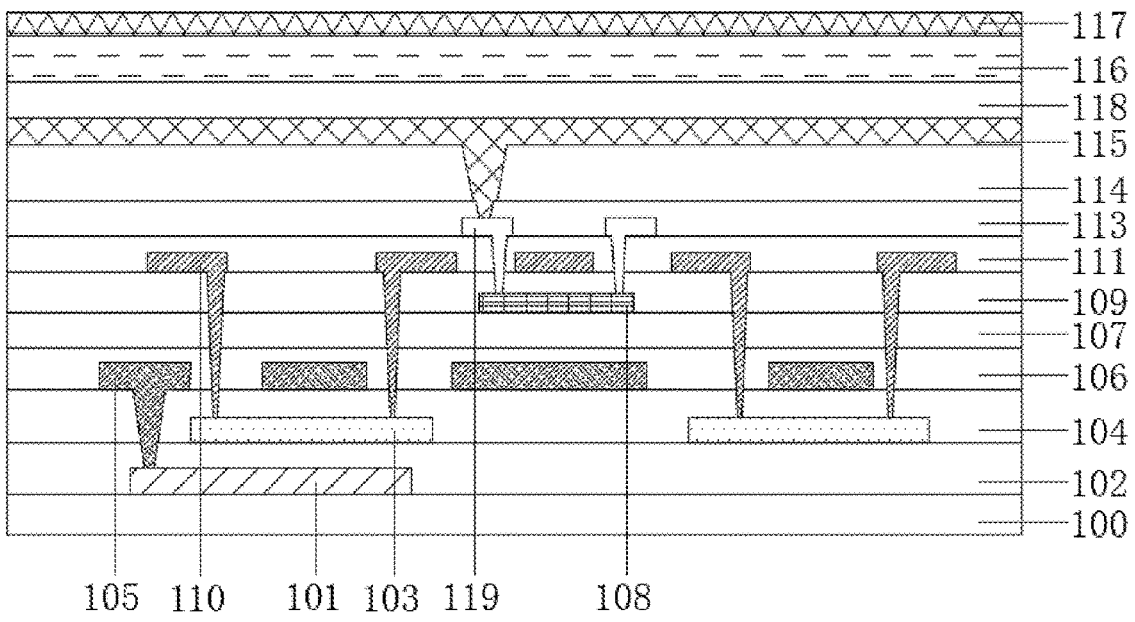
FIG. 7 is a schematic structural diagram illustrating an ultrasonic imaging base board proposed by an embodiment of the present disclosure.

Referring to FIG. 7, an embodiment of the present disclosure further provides an ultrasonic imaging base board including a signal amplification transistor, a conversion transistor and a piezoelectric conversion unit. The signal amplification transistor is connected to the conversion transistor, the piezoelectric conversion unit is connected to the conversion transistor. The piezoelectric conversion unit is configured to convert an ultrasonic pressure signal received by the ultrasonic imaging base board into an electrical signal, and the conversion transistor is configured to transfer the electrical signal to the signal amplification transistor, and the signal amplification transistor is configured to amplify the electrical signal.

Figure 8:
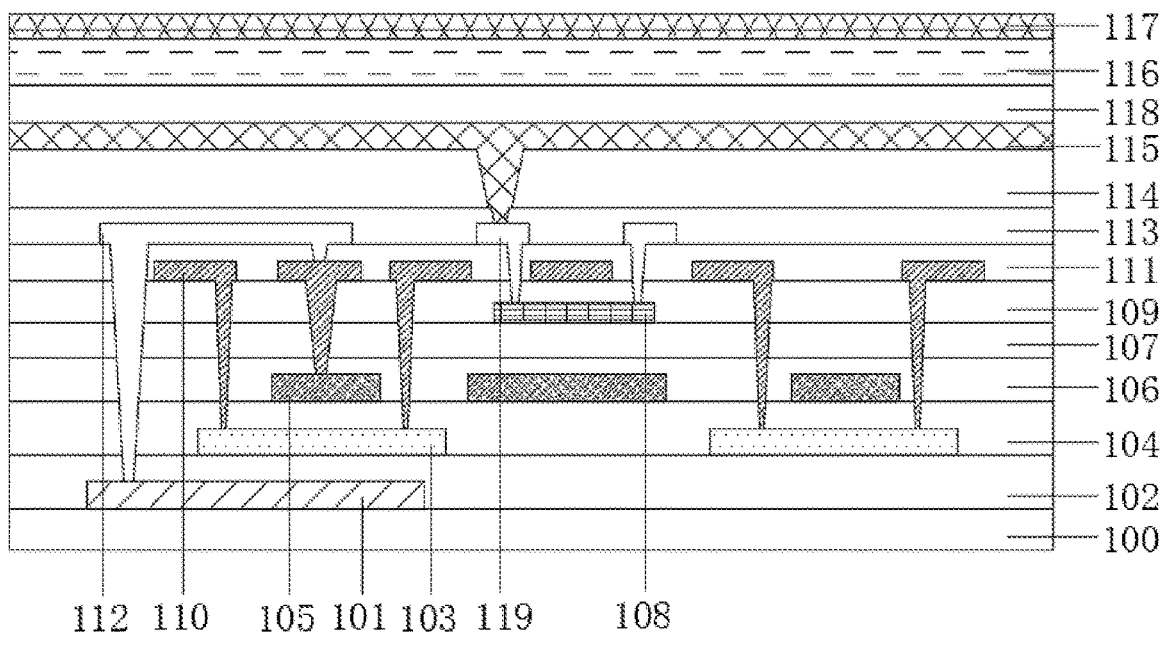
FIG. 8 is a schematic structural diagram illustrating another ultrasonic imaging base board proposed by an embodiment of the present disclosure.
Figure 12:
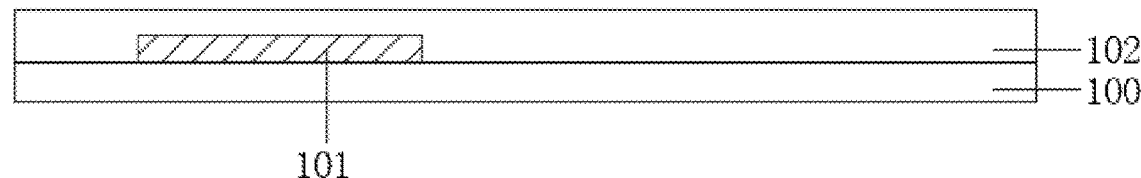
FIG. 12 is a schematic structural diagram illustrating a thin film transistor proposed by an embodiment of the present disclosure with a first gate insulation layer being prepared.
Figure 13:
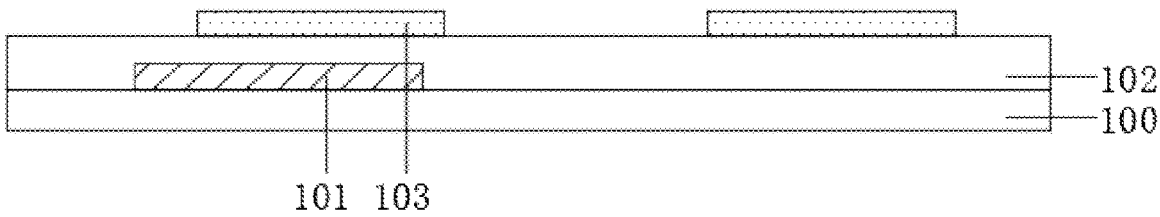
FIG. 13 is a schematic structural diagram illustrating a thin film transistor proposed by an embodiment of the present disclosure with a first active layer being prepared.
Figure 14:
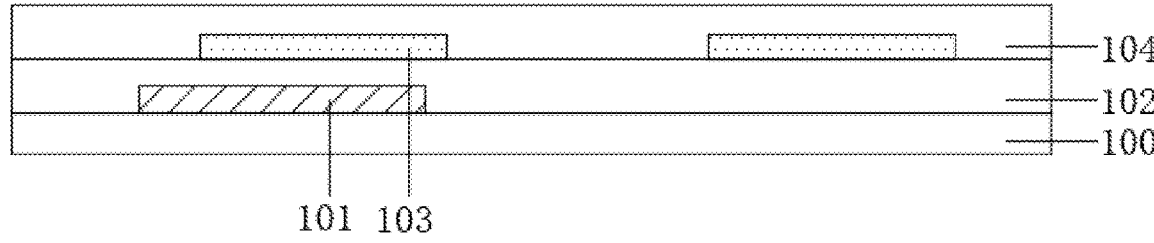
FIG. 14 is a schematic structural diagram illustrating a thin film transistor proposed by an embodiment of the present disclosure with a second gate insulation layer being prepared.
Figure 15:
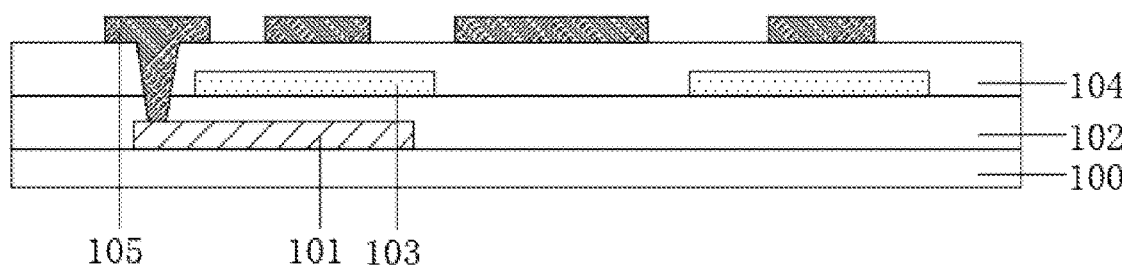
FIG. 15 is a schematic structural diagram illustrating a thin film transistor proposed by an embodiment of the present disclosure with a second gate being prepared.

Specifically, the signal amplification transistor may be any thin film transistor provided in the above embodiments of the present disclosure. The signal amplification transistor in the ultrasonic imaging substrate shown in FIG. 7 is a thin film transistor in which the first gate 101 is directly connected to the second gate 105. The signal amplification transistor in the ultrasonic 20) imaging substrate shown in FIG. 8 is a thin film transistor in which the first gate 101 is connected to the second gate 105 through the transfer metal layer 112 and the third gate 110.

Specifically, as shown in FIG. 7, the conversion transistor of the ultrasonic imaging base board may include a buffer layer 107, a second active layer 108 and a connection metal layer 119.

Further, as shown in FIG. 7, the buffer layer 107 is formed between the first interlayer dielectric layer 106 and the third gate insulation layer 109; the second active layer 108 is formed on a side of the buffer layer 107 facing away from the second gate 105, and the third gate insulation layer 109 is arranged to cover the second active layer 108.

In the embodiment of the present disclosure, the conversion transistor is an oxide transistor, so the material of the second active layer 108 may be IGZO (Indium gallium zinc oxide).

The connection metal layer 119 is formed on a side of the second interlayer dielectric layer 111 facing away from the second active layer 108, the connection metal layer 119 served as the source and drain of the conversion transistor is connected to the second active layer 108, and the connection metal layer 119 is located between the second active layer 108 of the conversion transistor and the piezoelectric conversion unit.

In the embodiment of the present disclosure, a part of the third gate 110 is used as the gate of the conversion transistor in the ultrasonic imaging base board, so the connection metal layer 119 served as the source and drain is located on opposite sides of the third gate 110 as the gate of the conversion transistor. Moreover, the connection metal layer 119 is connected to opposite two sides of the second active layer 108 through via holes penetrating through the second interlayer dielectric layer 111 and the third gate insulation layer 109.

As shown in FIG. 7, the piezoelectric conversion unit includes a first electrode layer 115, a piezoelectric thin film layer 116 and a second electrode layer 117.

Specifically, the first electrode layer 115 is formed on a side of the connection metal layer 119 facing away from the second active layer 108, and the first electrode layer 115 is connected to the connection metal layer 119, so as to realize the transmission of electrical signals.

The piezoelectric film layer 116 is formed on a side of the first electrode layer 115 facing away from the connection metal layer 119, the second electrode layer 117 is formed on a side of the piezoelectric film layer 116 facing away from the first electrode layer 115, and the second electrode layer 117 and the piezoelectric film layer 116 are in direct contact.

The first electrode layer 115 and the second electrode layer 117 may adopt conductive materials with better electrical conductivity. For example, the first electrode layer 115 may adopt ITO (indium tin oxide), etc., while the second electrode layer 117 may adopt silver, etc. The piezoelectric film layer 116 may include polyvinylidene fluoride (PVDF), PVDF has high chemical stability, low moisture absorption, high thermal stability, high resistance to ultraviolet radiation, high impact resistance, fatigue resistance, and the resonance frequency of the stretching vibration in the thickness direction is very high, and a wide flat response can be obtained.

When an ultrasonic pressure is received, the piezoelectric film layer 116 converts the ultrasonic pressure signal into an electrical signal, and the electrical signal is transferred to the conversion transistor through the first electrode layer 115, and the conversion transistor transfers the electrical signal to the signal amplification transistor, thereby realizing the amplification of the electrical signal.

As shown in FIG. 7, the ultrasonic imaging base board further includes a fifth insulation layer disposed between the first electrode layer 115 and the connection metal layer 119.

In an optional implementation, the fifth insulation layer may include a first passivation layer 113 and a planarization layer 114.

Specifically, the first passivation layer 113 is formed on a side of the second interlayer dielectric layer 111 facing away from the third gate insulation layer 109, and the first passivation layer 113 is arranged to cover the connection metal layer 119, and the first passivation layer 113 may include inorganic materials such as silicon oxide and silicon nitride. The planarization layer 114 is formed on a side of the first passivation layer 113 facing away from the connection metal layer 119, and the planarization layer 114 is arranged to cover the first passivation layer 113, and the planarization layer 114 may include organic materials such as resin, polyimide and the like.

Moreover, in order to protect the ultrasonic imaging base board, as shown in FIG. 7, a second passivation layer 118 may also be formed between the first electrode layer 115 and the piezoelectric film layer 116, and the second passivation layer 118 is arranged to cover the first electrode layer 115. The second passivation layer 118 may include inorganic materials such as silicon oxide, silicon nitride, and the like.

As shown in FIG. 8, when the signal amplification transistor is a thin film transistor in which the first gate 101 is connected to the second gate 105 through the transfer metal layer 112 and the third gate 110, the ultrasonic imaging base board further includes the transfer metal layer 112.

Specifically, the transfer metal layer 112 and the connection metal layer 119 may be provided in the same layer, that is, the transfer metal layer 112 and the connection metal layer 119 may be formed using the same manufacturing material and in the same preparing process.

Moreover, the ultrasonic imaging base board further includes an addressing circuit. After the electrical signal is output from the conversion transistor and amplified by the signal amplification transistor, it will pass through the addressing circuit to finally output an electrical signal distributed in an array, thereby achieving final ultrasonic imaging.

According to the ultrasonic imaging base board provided by the present disclosure, the signal amplification transistor is the thin film transistor provided by the embodiment of the present disclosure, so that the first gate 101 in the signal amplification transistor and the first active layer 103 form double channels. In this way, under the same voltage, the signal amplification transistor can output more current, the trans-conductance of the signal amplification transistor is increased, thereby improving the signal amplification capability and the resolution of the ultrasonic display substrate. On the other hand, after a fixed potential is generated under the first active layer 103, the floating body effect of the signal amplification transistor can be suppressed, thereby improving the current uniformity, reducing the noises of the signal system, and improving the signal-to-noise ratio.

An embodiment of the present disclosure further provides an ultrasonic imaging device including any ultrasonic imaging base board provided in the embodiments of the present disclosure. The ultrasonic imaging device may also include a back-end processing system. The back-end processing system is configured to receive dynamic electrical signals arranged in an array output by the ultrasonic imaging base board, and then form an ultrasonic image on the display according to the dynamic electrical signals arranged in an array.

FIG. 9 is a flowchart illustrating steps of a method for preparing a thin film transistor. Referring to FIG. 9, an embodiment of the present disclosure provides a method for preparing a thin film transistor, and the method may include steps below.

At step 301, a substrate 100 is provided.

Specifically, the substrate 100 may be made of glass materials, as shown in FIG. 10.

At step 302, a first gate 101, a first gate insulation layer 102, a first active layer 103, a second gate insulation layer 104 and a second gate 105 are sequentially formed on a side of the substrate 100, and the first gate 101 is arranged to be closer to the substrate 100.

The orthographic projection of the first gate 101 on the substrate 100, the orthographic projection of the second gate 105 on the substrate 100, and the orthographic projection of the first active layer 103 on the substrate 100 overlap with each other, and the first gate 101 is connected to the second gate 105.

Specifically, as shown in FIG. 11 to FIG. 15, this step may specifically include steps below.

At step 3021, the first gate 101 is formed on a side of the substrate 100 and is patterned.

At step 3022, the first gate insulation layer 102 is formed on the substrate 100, and the first gate insulation layer 102 is arranged to cover the first gate 101.

At step 3023, an a-Si layer is formed on the first gate insulation layer 102, and then the a-Si layer is crystallized and patterned to form the first active layer 103.

At step 3024, the second gate insulation layer 104 is formed on the first gate insulation layer 102, the second gate insulation layer 104 being arranged to cover the first active layer 103, and then the second gate 105 is formed on the second gate insulation layer 104, so that the second gate 105 is connected to the first gate 101 through a via hole penetrating through the second gate insulation layer 104 and the first gate insulation layer 102.

In addition, in another thin film transistor, as shown in FIG. 16 and FIG. 17, the preparation method further includes steps below.

At step 3025, the first interlayer dielectric layer 106 and the buffer layer 107 are sequentially formed on the second gate insulation layer 104.

At step 3026, the third gate insulation layer 109 is formed on the buffer layer 107, and then the third gate 110 is formed on the third gate insulation layer 109, so that a part of the third gate 110 is connected to the second gate 105 through a via hole penetrating through the third gate insulation layer 109, the buffer layer 107 and the first interlayer dielectric layer 106.

At step 3027, the second interlayer dielectric layer 111 is formed on the third gate insulation layer 109, and is patterned.

At step 3028, the transfer metal layer 112 is formed on the second interlayer dielectric layer 111, and is patterned, so that a part of the transfer metal layer 112 is connected to the first gate 101 through a via hole penetrating the second interlayer dielectric layer 111, the third gate insulation layer 109, the buffer layer 107, the first interlayer dielectric layer 106, the second gate insulation layer 104 and the first gate insulation layer 102. Moreover, another part of the transfer metal layer 112 is also in contact with the third gate 110 through a via hole penetrating through the second interlayer dielectric layer 111 to realize the electrical connection, thereby realizing the connection between the second gate 105 and the first gate 101.

According to the preparation method of the thin film transistor provided in the present disclosure, on the one hand, the first gate 101 is arranged to be connected to the second gate 105, so that the first gate 101 and the first active layer 103 in the thin film transistor form double channels. Under the same voltage, the thin film transistor can output more current, thereby increasing the trans-conductance of the thin film transistor, and improving the signal amplification capability; on the other hand, after a fixed potential is generated under the first active layer 103, the floating body effect of the thin film transistor can be suppressed, thereby improving the current uniformity, reducing the noises of the signal system, and improving the signal-to-noise ratio.

In addition, an embodiment of the present disclosure further provides a method for preparing an ultrasonic imaging base board. In addition to the method for preparing a thin film transistor provided in the embodiment of the present disclosure, the method further includes steps below.

At step 401, the second active layer 108 is formed on the buffer layer 107, and is patterned, as shown in FIG. 18.

Figures 19, 20:
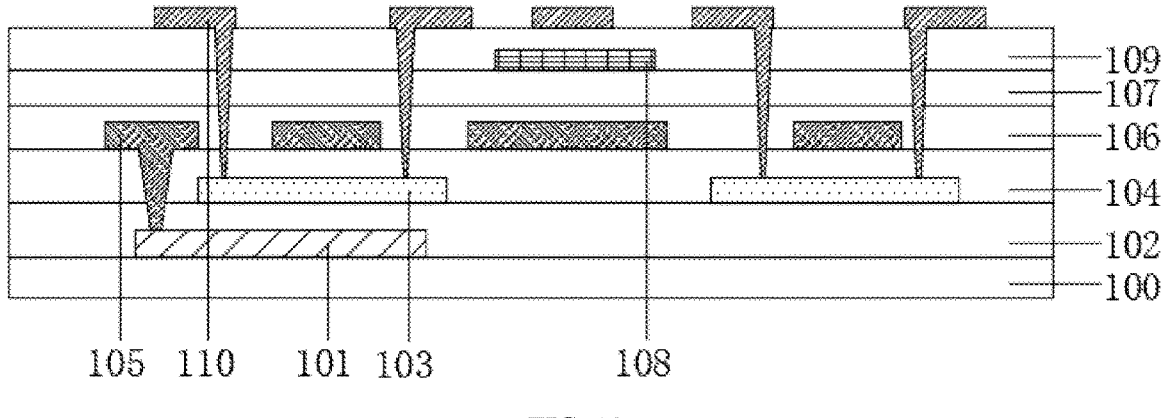
FIG. 19 is a schematic structural diagram illustrating an ultrasonic display substrate proposed by an embodiment of the present disclosure with a third gate insulation layer and a third gate being prepared.
FIG. 20 is a schematic structural diagram illustrating an ultrasonic display substrate proposed by an embodiment of the present disclosure with a second interlayer dielectric layer and a metal layer being prepared.

At step 402, the third gate insulation layer 109 is formed on the buffer layer 107, so that the third gate insulation layer 109 covers the second active layer 108, and the first interlayer dielectric layer 106, the buffer layer 107 and the third gate insulation layer 109 are patterned, as shown in FIG. 19.

At step 403, the third gate 110 is formed on the third gate insulation layer 109, and is patterned, so that the third gate 110 is electrically connected to the first active layer 103 through a via hole penetrating through the first interlayer dielectric layer 106, the buffer layer 107 and the third gate insulation layer 109, as shown in FIG. 19.

At step 404, the second interlayer dielectric layer 111 is formed on the third gate insulation layer 109, and the second interlayer dielectric layer 111 is arranged to cover the third gate 110, as shown in FIG. 20.

At step 405, the connection metal layer 119 is formed on the second interlayer dielectric layer 111, and is patterned, so that the connection metal layer 119 is electrically connected to the second active layer 108 through a via hole penetrating through the second interlayer dielectric layer 111 and the third gate insulation layer 109, as shown in FIG. 20.

At step 406, the first passivation layer 113 and the planarization layer 114 are sequentially formed on the second interlayer dielectric layer 111, and are patterned. The first passivation layer 113 is arranged to cover the connection metal layer 119, as shown in FIG. 21.

Figure 21:
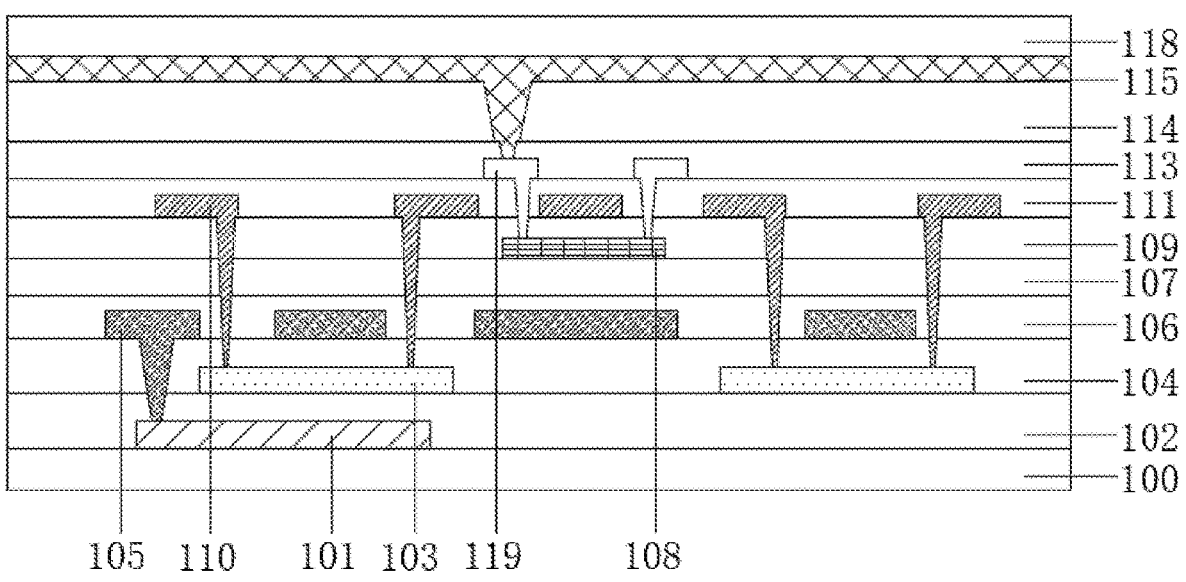
FIG. 21 is a schematic structural diagram illustrating an ultrasonic display substrate proposed by an embodiment of the present disclosure with a first passivation layer, a flat layer, a first electrode layer and a second passivation layer being prepared.

At step 407, the first electrode layer 115 is formed on the planarization layer 114, so that the first electrode layer 115 is electrically connected to the connection metal layer 119 through a via hole penetrating the planar layer 114 and the first passivation layer 113, as shown in FIG. 21.

At step 408, the second passivation layer 118 is formed on the first electrode layer 115, and is patterned, as shown in FIG. 21.

Figure 22:
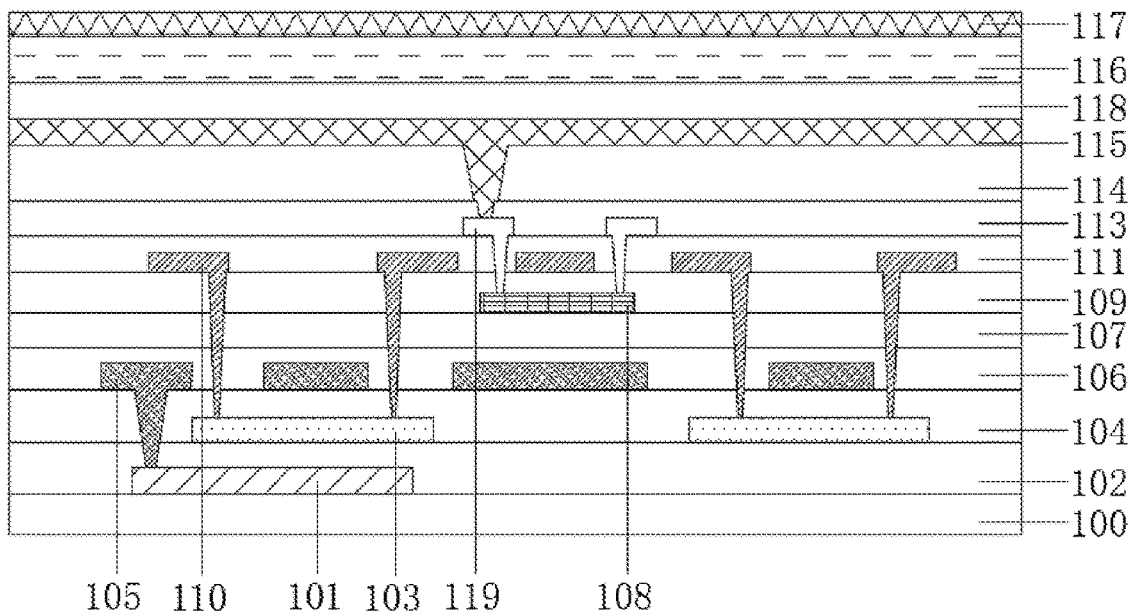
FIG. 22 is a schematic structural diagram illustrating an ultrasonic display substrate proposed by an embodiment of the present disclosure with a piezoelectric film layer and a second electrode layer being prepared.

At step 409, the piezoelectric film layer 116 and the second electrode layer 117 are sequentially formed on the second passivation layer 118 to complete the preparation of the ultrasonic imaging base board, as shown in FIG. 22.

According to the ultrasonic imaging base board prepared by the preparation method, the electrical connection between the second gate 105 and the first gate 101 is realized through the metal layer 112 and the third gate 110, which increases the trans-conductance of the signal amplification circuit, so that the ultrasonic imaging base board can meet the requirements of higher resolution. Moreover, by generating a fixed potential under the first active layer 103, the occurrence of charge parasitic thin film transistors can be reduced, thereby improving current uniformity and reducing signal noises.

References herein to "one embodiment," "an embodiment," or "one or more embodiments" mean that a particular feature, structure, or characteristic described in connection with the embodiments is included in at least one embodiment of the present disclosure. Additionally, please note that wordings such as "in one embodiment" herein do not necessarily all refer to the same embodiment.

In the description provided herein, numerous specific details are set forth. However, it is understood that embodiments of the present disclosure may be practiced without these specific details. In some instances, common methods, structures and techniques have not been shown in detail in order not to obscure the understanding of this description.

In the claims, any reference signs placed between parentheses shall not be construed as limiting the claim. The word "comprising" does not exclude the presence of elements or steps not listed in the claim. The word "a" or "an" preceding an element does not exclude the presence of a plurality of such elements. The disclosure may be implemented by means of hardware including several distinct elements and a suitably programmed computer. In a unit claim enumerating several devices, several of these devices may be embodied by the same hardware item. The words such as "first", "second", and "third" as used not indicate any order. These words may be interpreted as names.

Finally, it should be noted that the above embodiments are only used to illustrate the technical solutions of the present disclosure, rather than limiting them. Although the present disclosure has been described in detail with reference to the aforementioned embodiments, those skilled in the art should understand that, the technical solutions described in the aforementioned embodiments may still be modified, or an equivalent replacements may be performed on some of the technical features, without making the essence of the corresponding technical solutions departing from the spirit and scope of the technical solutions of the embodiments of the present disclosure.

The invention claimed is:

1. A thin film transistor, comprising:

a substrate, and a first gate, a first gate insulation layer, a first active layer, a second gate insulation layer, and a second gate stacked on a side of the substrate, wherein the first gate is disposed close to the substrate;

wherein an orthographic projection of the first gate on the substrate, an orthographic projection of the second gate on the substrate, and an orthographic projection of the first active layer on the substrate overlap with each other, and the first gate is connected to the second gate;

wherein the first active layer comprises:

a channel region, and a source contact region and a drain contact region located on two sides of the channel region;

wherein the orthographic projection of the first gate on the substrate and the orthographic projection of the second gate on the substrate cover the orthographic projection of the channel region on the substrate; an ion doping concentration of the source contact region and the drain contact region is greater than the ion doping concentration of the channel region;

wherein the channel region comprises: a first channel region and a second channel region separated from each other in a second direction;

the second gate comprises a first sub-gate and a second sub-gate separated from each other in the second direction;

wherein, in the second direction, the orthographic projection of the first sub-gate on the substrate completely overlaps with the orthographic projection of the first channel region on the substrate, and the orthographic projection of the second sub-gate on the substrate completely overlaps with the orthographic projection of the second channel region on the substrate.

2. The thin film transistor according to claim 1, wherein the second gate is connected to the first gate through a via hole penetrating through the first gate insulation layer and the second gate insulation layer.

3. The thin film transistor according to claim 1, further comprising:

a third gate disposed on a side of the second gate facing away from the substrate, wherein the third gate is served as a source and a drain of the thin film transistor, and is connected to the first active layer.

4. The thin film transistor according to claim 3, wherein the third gate is connected to the second gate;

the thin film transistor further comprises a transfer metal layer disposed on a side of the third gate facing away from the second gate, and the transfer metal layer is connected to the first gate and the third gate respectively.

5. The thin film transistor according to claim 4, further comprising:

a third insulation layer disposed between the second gate and the third gate; and a fourth insulation layer disposed between the third gate and the transfer metal layer;

wherein the transfer metal layer is connected to the first gate through a via hole penetrating through the fourth insulation layer, the third insulation layer, the second gate insulation layer and the first gate insulation layer;

the transfer metal layer is connected to the third gate through a via hole penetrating through the fourth insulation layer;

the third gate is connected to the second gate through a via hole penetrating through the third insulation layer.

6. The thin film transistor according to claim 1, wherein a material of the channel region comprises polysilicon, amorphous silicon, or oxide semiconductor.

7. A thin film transistor, comprising:

a substrate, and a first gate, a first gate insulation layer, a first active layer, a second gate insulation layer, and a second gate stacked on a side of the substrate, wherein the first gate is disposed close to the substrate;

wherein an orthographic projection of the first gate on the substrate, an orthographic projection of the second gate on the substrate, and an orthographic projection of the first active layer on the substrate overlap with each other, and the first gate is connected to the second gate;

wherein the first active layer comprises a plurality of sub-regions separated from each other in a first direction;

in the first direction, the orthographic projection of the first gate on the substrate and the orthographic projection of the second gate on the substrate both cover the orthographic projection of the first active layer on the substrate;

a recessed region exists between two adjacent sub-regions, and the second gate is arranged to at least partially fill the recessed region, and the orthographic projection of the second gate on a first plane at least partially covers the orthographic projection of the sub-region on the first plane;

wherein the first plane is perpendicular to the first direction.

8. An ultrasonic imaging base board, comprising a signal amplification transistor and a conversion transistor connected to the signal amplification transistor, wherein the signal amplification transistor is a thin film transistor comprising a substrate, and a first gate, a first gate insulation layer, a first active layer, a second gate insulation layer, and a second gate stacked on a side of the substrate, wherein the first gate is disposed close to the substrate; an orthographic projection of the first gate on the substrate, an orthographic projection of the second gate on the substrate, and an orthographic projection of the first active layer on the substrate overlap with each other, and the first gate is connected to the second gate;

wherein the ultrasonic imaging base board further comprises:

a piezoelectric conversion unit, configured to convert an ultrasonic pressure signal received by the ultrasonic imaging base board into an electrical signal, and the piezoelectric conversion unit is connected to the conversion transistor.

9. The ultrasonic imaging base board according to claim 8, wherein the conversion transistor comprises:

a buffer layer, disposed on a side of the signal amplification transistor;

a second active layer disposed on the buffer layer; and a connection metal layer disposed between the piezoelectric conversion unit and the second active layer, wherein the connection metal layer is served as the source and drain of the conversion transistor, and is connected to the second active layer.

10. The ultrasonic imaging base board according to claim 9, wherein the signal amplification transistor comprises a transfer metal layer; and the transfer metal layer and the connection metal layer are arranged in the same layer.

11. The ultrasonic imaging base board according to claim 8, wherein the piezoelectric conversion unit comprises:

a first electrode layer disposed on a side of the connection metal layer facing away from the second active layer, and the first electrode layer is connected to the connection metal layer;

a piezoelectric film layer disposed on a side of the first electrode layer facing away from the connection metal layer; and a second electrode layer disposed on a side of the piezoelectric film layer facing away from the first electrode layer.

12. The ultrasonic imaging base board according to claim 11, further comprising:

a fifth insulation layer disposed between the first electrode layer and the connection metal layer, and the first electrode layer is connected to the connection metal layer through a via hole penetrating through the fifth insulation layer.

13. The ultrasonic imaging base board according to claim 11, further comprising a second passivation layer disposed between the first electrode layer and the piezoelectric film layer.

14. An ultrasonic imaging device, comprising the ultrasonic imaging base board according to claim 8.

\* \* \* \* \*